US012803457B2

(12) United States Patent
Masuzawa

(10) Patent No.: US 12,803,457 B2
(45) Date of Patent: Nov. 17, 2026

(54) POWER CONVERSION DEVICE WITH REDUCING PARASITIC INDUCTANCE

(71) Applicant: MITSUBISHI HEAVY INDUSTRIES, LTD., Tokyo (JP)

(72) Inventor: Takashi Masuzawa, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 144 days.

(21) Appl. No.: 18/858,427

(22) PCT Filed: Feb. 7, 2023

(86) PCT No.: PCT/JP2023/003986
§ 371 (c)(1),
(2) Date: Oct. 21, 2024

(87) PCT Pub. No.: WO2023/210098
PCT Pub. Date: Nov. 2, 2023

(65) Prior Publication Data

US 2025/0274052 A1 Aug. 28, 2025

(30) Foreign Application Priority Data

Apr. 28, 2022 (JP) ................................ 2022-075380

(51) Int. Cl.
*H02M 7/00* (2006.01)
*H05K 7/14* (2006.01)
*H02M 3/00* (2006.01)

(52) U.S. Cl.
CPC ........ *H02M 7/003* (2013.01); *H05K 7/14329* (2022.08); *H02M 3/003* (2021.05)

(58) Field of Classification Search
CPC .............................. H02M 3/003; H02M 7/003
See application file for complete search history.

(56) References Cited

U.S. PATENT DOCUMENTS

2010/0132193 A1* 6/2010 Yoshinaga ............ H10W 90/00 29/874
2011/0008669 A1* 1/2011 Ogasawara ....... H01M 10/0413 429/160

(Continued)

FOREIGN PATENT DOCUMENTS

JP H11-055938 A 2/1999
JP 2002-119069 A 4/2002

(Continued)

OTHER PUBLICATIONS

International Search Report dated Mar. 14, 2023, issued in counterpart Application No. PCT/JP2023/003986, with English translation. (4 pages).

(Continued)

*Primary Examiner* — Sisay G Tiku
(74) *Attorney, Agent, or Firm* — WHDA, LLP

(57) ABSTRACT

A power conversion device includes a connection conductor including a positive electrode-side busbar configured to connect the capacitor and a P-type terminal of the power module, and a negative electrode-side busbar configured to connect the capacitor and an N-type terminal of the power module. The positive electrode-side busbar includes a first main body portion including a first bottom surface abutting on the P-type terminal and a first opposing surface rising from the first bottom surface and a first cutout portion formed in at least part of the first main body portion. The negative electrode-side busbar includes a second main body portion including a second bottom surface abutting on the N-type terminal and a second opposing surface rising from the second bottom surface and disposed opposed to the first opposing surface with a gap therebetween and a second cutout portion formed in at least part of the second main body portion.

2 Claims, 8 Drawing Sheets

(56) References Cited

U.S. PATENT DOCUMENTS

| | | | | |
|---|---|---|---|---|
| 2014/0355221 | A1* | 12/2014 | Sawada | H05K 7/14329 361/735 |
| 2019/0036282 | A1* | 1/2019 | Tanabe | H01R 25/162 |
| 2021/0143747 | A1 | 5/2021 | Sano et al. | |
| 2021/0143748 | A1* | 5/2021 | Ikegami | H05K 7/14329 |
| 2023/0336091 | A1* | 10/2023 | Takahashi | H02M 1/0048 |
| 2025/0105070 | A1* | 3/2025 | Ezumi | H02M 7/003 |

FOREIGN PATENT DOCUMENTS

| | | | |
|---|---|---|---|
| JP | 2004-165309 | A | 6/2004 |
| WO | 2020/021881 | A1 | 1/2020 |

OTHER PUBLICATIONS

Written Opinion dated Mar. 14, 2023, issued in counterpart CN Application No. PCT/JP2023/003986, with English translation. (6 pages).

* cited by examiner

POWER CONVERSION DEVICE WITH REDUCING PARASITIC INDUCTANCE

The present disclosure relates to a power conversion device.

Priority is claimed by the present application on JP 2022-75380, filed Apr. 28, 2022, the content of which is incorporated herein by reference.

BACKGROUND ART

For example, Patent Document 1 discloses a power conversion device in which a positive electrode side conductor and a negative electrode side conductor each connected to a capacitor are stacked in a laminate structure sandwiching an insulating layer therebetween.

The positive electrode side conductor and the negative electrode side conductor as connection conductors both have a flat plate shape and are opposed in a state of being parallel to each other with the insulating layer therebetween.

Accordingly, when a current flows through the positive electrode side conductor and the negative electrode side conductor, magnetic fluxes generated in the positive electrode side conductor and the negative electrode side conductor cancel each other, and as a result, parasitic inductance is reduced.

For example, Patent Document 2 discloses a semiconductor device including a main terminal group as a connection conductor configured by continuously arranging three or more main terminals.

In the main terminal group, a main terminal as a collector terminal connected to a collector electrode of a semiconductor chip and a main terminal as an emitter terminal connected to an emitter electrode of the semiconductor chip are alternately arranged in a state of being adjacent to each other.

That is, side surface facing portions of the main terminals are arranged in parallel.

Accordingly, since the side surfaces of the plurality of collector terminals and the emitter terminals are opposed to each other, when a main current flows through the collector terminals and the emitter terminals, magnetic fluxes generated in the collector terminals and the emitter terminals cancel each other, and as a result, the parasitic inductance is reduced.

CITATION LIST

Patent Literature

Patent Document 1: JP2002-119069 A
Patent Document 2: WO 2020/021881 A

SUMMARY OF INVENTION

Technical Problem

In recent years, in the field of a power conversion device including a power semiconductor element, there has been an increasing trend toward higher voltage, larger current, higher frequency, and faster switching in order to improve added value.

Accordingly, it is desired to further reduce parasitic inductance generated in a connection conductor.

In the laminate structure in the power conversion device described in Patent Document 1, there is a high risk of dielectric breakdown occurring in the insulating layer sandwiched between the positive electrode side conductor and the negative electrode side conductor.

When the thickness of the insulating layer is increased for the purpose of avoiding the dielectric breakdown of the insulating layer, an interaction that cancels the magnetic fluxes between the positive electrode side conductor and the negative electrode side conductor each other may be reduced.

In the semiconductor device described in Patent Document 2, among the surfaces of the main terminals, the side surfaces each having a relatively small area are opposed to each other.

Therefore, for example, as compared with the arrangement of the positive electrode side conductor and the negative electrode side conductor described in Patent Document 1, the magnetic fluxes generated in the main terminals may not smoothly cancel each other.

For example, in a case where the main terminal is formed or disposed to be thick so that the area of the opposing surface is increased, the main terminal may be increased in size and weight.

The present disclosure has been made to solve the above problem, and an object of the present disclosure is to provide a power conversion device that can reduce parasitic inductance generated in a connection conductor while suppressing an increase in size and weight of the connection conductor.

Solution to Problem

In order to solve the above problem, a power conversion device according to the present disclosure includes a capacitor to which DC power is supplied, a power module configured to convert a DC voltage from the capacitor into an AC voltage and output the AC voltage, and a connection conductor including a positive electrode-side busbar configured to connect the capacitor and a P-type terminal of the power module and a negative electrode-side busbar having a shape identical to a shape of the positive electrode-side busbar, symmetrically arranged side by side with the positive electrode-side busbar in pairs with a gap therebetween, and configured to connect the capacitor and an N-type terminal of the power module. The positive electrode-side busbar includes a first main body portion including a first bottom surface abutting on the P-type terminal and a first opposing surface rising from the first bottom surface and a first cutout portion disposed in at least part of the first main body portion on a side opposite to the first bottom surface and the first opposing surface. The negative electrode-side busbar includes a second main body portion including a second bottom surface abutting on the N-type terminal and a second opposing surface rising from the second bottom surface and disposed in parallel to and opposed to the first opposing surface with a gap therebetween and a second cutout portion disposed in part of the second main body portion on a side opposite to the second bottom surface and the second opposing surface.

Advantageous Effects of Invention

According to the present disclosure, a power conversion device that can reduce parasitic inductance generated in a connection conductor while suppressing an increase in size and weight of the connection conductor can be provided.

DESCRIPTION OF EMBODIMENTS

Hereinafter, embodiments for implementing a power conversion device according to the present disclosure will be described with reference to the accompanying drawings.

Power Conversion Device

The power conversion device is a device that converts DC power into AC power, converts AC power into DC power, or converts DC power into DC power having a different potential.

Examples of the power conversion device of the present embodiment include an inverter used in a system of a power plant or the like, an inverter used for driving an electric motor of an electric vehicle, or the like.

In the present embodiment, an inverter for controlling an electric motor (motor) will be described as an example of the power conversion device.

Figure 1:
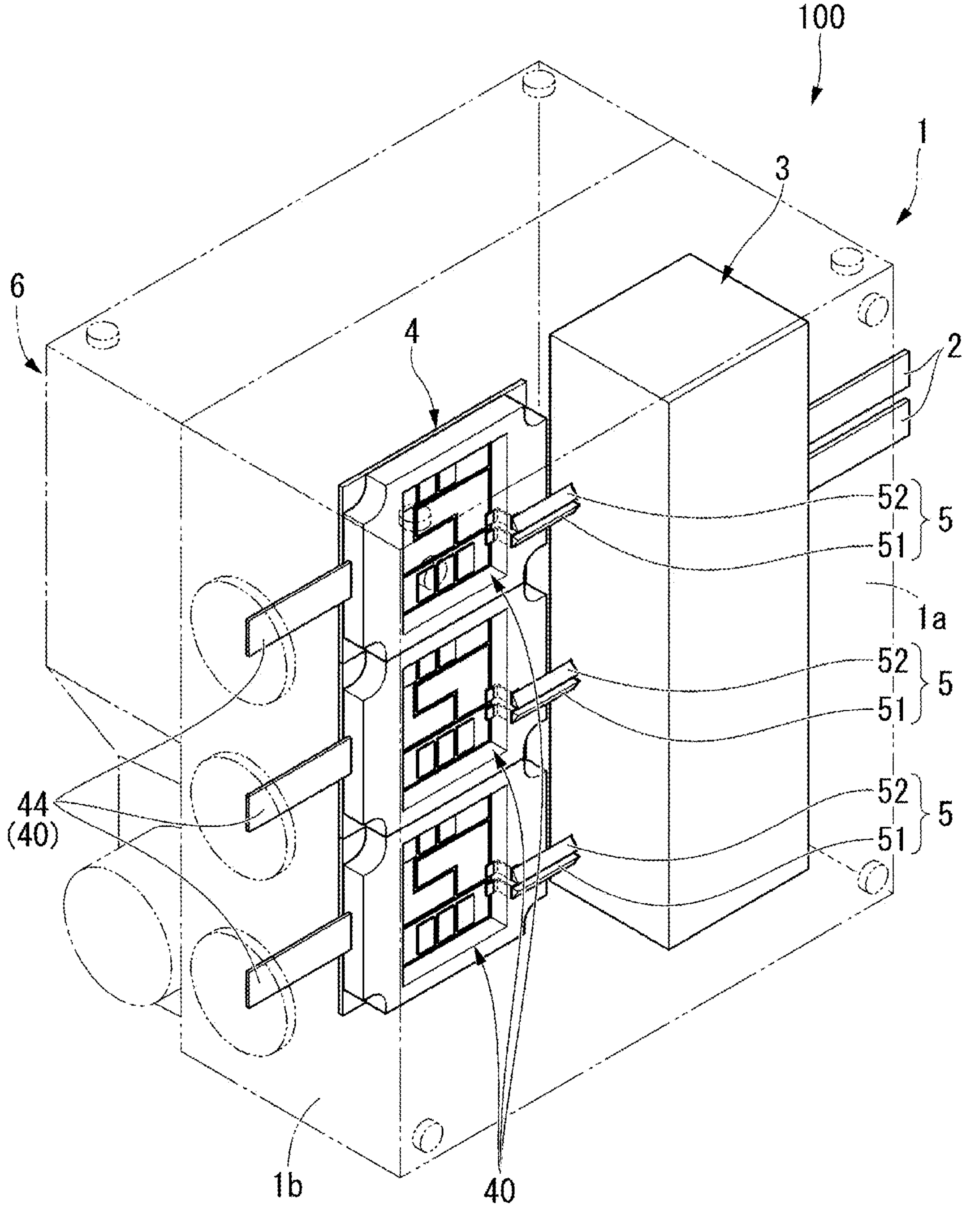
FIG. 1 is a perspective view illustrating a schematic configuration of a power conversion device according to an embodiment of the present disclosure.

As illustrated in FIG. 1, a power conversion device 100 includes a casing 1, an external input conductor 2, a capacitor 3, a power conversion unit 4, a cooling device 6, and a connection conductor 5.

Casing

The casing 1 forms an outer shell of the power conversion device 100.

The casing 1 in the present embodiment is made of a metal such as aluminum, a synthetic resin, or the like, and has a rectangular parallelepiped shape.

The casing 1 includes two side surfaces arranged so as to be back-to-back with each other.

Hereinafter, among these two side surfaces, a side surface opposing one side is referred to as an "input-side side surface 1*a*", and a side surface opposing the other side is referred to as an "output-side side surface 1*b*".

The external input conductor 2 for inputting DC power is led out from the input-side side surface 1*a*.

External Input Conductor

The external input conductors 2 are a pair of electrical conductors (busbars) that supply DC power supplied from a DC power supply or the like provided outside the power conversion device 100 to the capacitor 3.

The external input conductor 2 in the present embodiment is made of a metal including copper or the like.

One end of the external input conductor 2 is connected to the capacitor 3, and the other end of the external input conductor 2 extends in a direction intersecting the input-side side surface 1*a* of the casing 1.

Capacitor

The capacitor 3 is a smoothing capacitor for storing electric charge input from the external input conductor 2 and suppressing voltage fluctuation associated with power conversion.

The DC voltage smoothed by suppressing ripples through the capacitor 3 is supplied to the power conversion unit 4.

Power Conversion Unit

The power conversion unit 4 converts the voltage input from the capacitor 3.

In order to output three-phase AC power, the power conversion unit 4 in the present embodiment includes three power modules 40 responsible for outputs for the U phase, the V phase, and the W phase, respectively.

Power Module

The power module 40 is a device that converts input power and outputs the converted power.

The power module 40 in the present embodiment constitutes a part of the power conversion unit 4.

Figure 2:
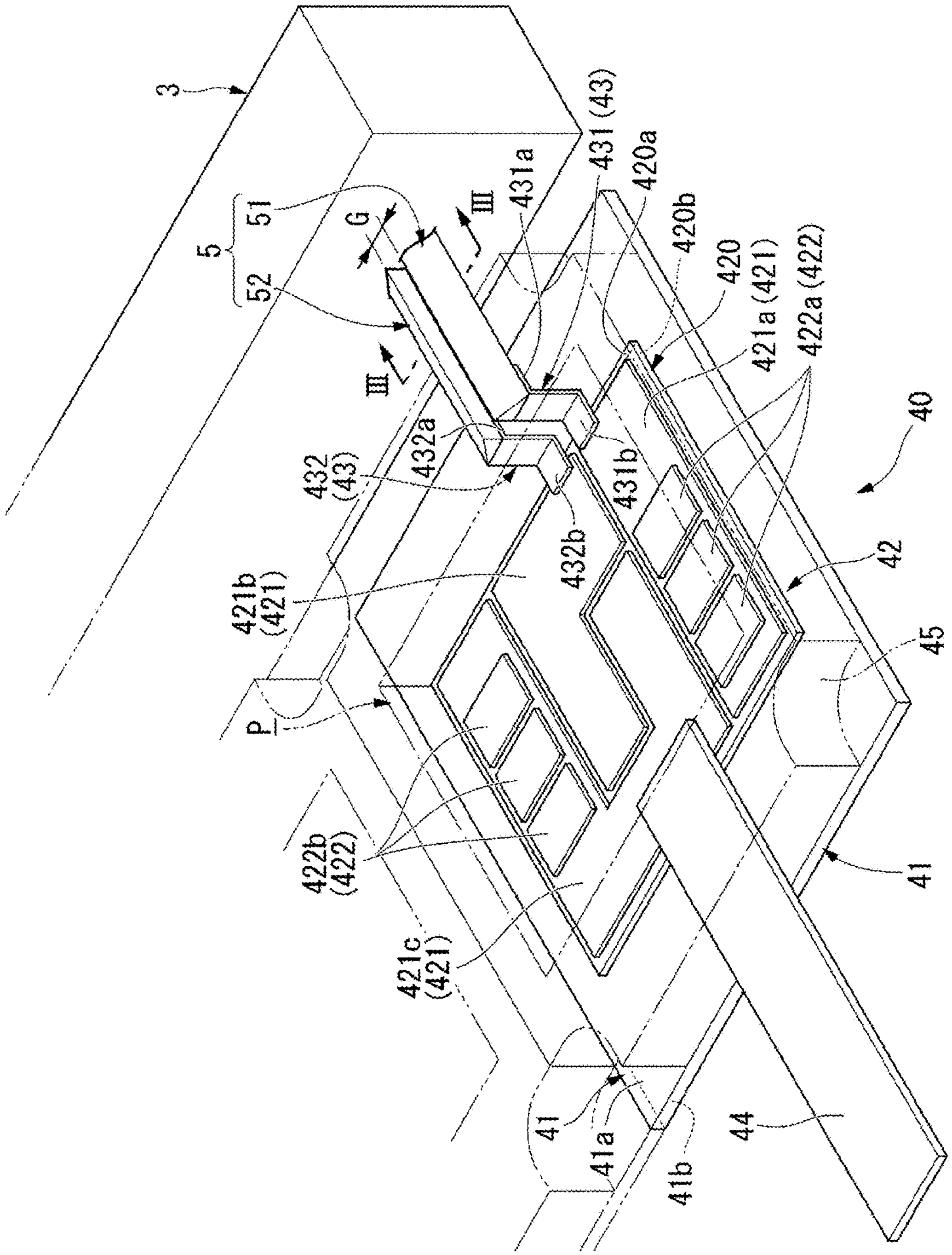
FIG. 2 is an enlarged perspective view of a main part of the power conversion device illustrated in FIG. 1.

As illustrated in FIG. 2, the power module 40 includes a base plate 41, a circuit board 42, a main terminal portion 43, an external output conductor 44, and a reinforcing portion 45.

The base plate 41 is a member having a flat plate shape.

The base plate 41 includes a main surface 41*a* and a back surface 41*b* located on the back side of the main surface 41*a*.

That is, the main surface 41*a* and the back surface 41*b* of the base plate 41 are back-to-back in a state of being parallel to each other.

The back surface 41*b* of the base plate 41 is fixed to, for example, the cooling device 6 with a bonding material or the like (not illustrated) therebetween.

The base plate 41 in the present embodiment is made of, for example, copper.

The base plate 41 may be made of a metal other than copper.

The circuit board 42 includes an insulating plate 420, a front surface pattern 421, a power semiconductor element 422, and a back surface pattern (not illustrated for convenience of illustration).

The insulating plate 420 has a flat plate shape.

The insulating plate 420 includes a first surface 420*a* and a second surface 420*b* located on the back side of the first surface 420*a*.

That is, the first surface 420*a* and the second surface 420*b* of the insulating plate 420 are back-to-back in a state of being parallel to each other.

A back surface pattern, which is a pattern of copper foil or the like, is formed on the second surface 420*b* of the insulating plate 420.

The back surface pattern is fixed to the center of the main surface 41*a* of the base plate 41 with a bonding material or the like (not illustrated) therebetween.

The insulating plate 420 is made of an insulating material such as ceramic.

In addition to ceramic, paper phenol, paper epoxy, glass composite, glass epoxy, glass polyimide, fluororesin, or the like can be used as the insulating material forming the insulating plate 420.

The front surface pattern 421 is a pattern of copper foil or the like formed on the first surface 420*a* of the insulating plate 420 and extending in a planar shape.

The front surface pattern 421 is formed by, for example, being fixed to the first surface 420*a* of the insulating plate 420 by adhesion or the like and then being etched or the like.

A plurality of the front surface patterns 421 are disposed on the first surface 420*a* of the insulating plate 420.

The plurality of front surface patterns 421 are arranged adjacent to each other with a gap therebetween in a direction in which the insulating plate 420 extends.

In the present embodiment, a case where three front surface patterns 421 are arranged on the first surface 420*a* will be described as an example.

Hereinafter, for convenience of description, these three front surface patterns 421 are referred to as a first front surface pattern 421*a*, a second front surface pattern 421*b*, and a third front surface pattern 421*c*.

The main terminal portion 43 (P-type terminal 431) as a positive electrode for inputting a direct current is connected to the first front surface pattern 421*a*.

The main terminal portion 43 (N-type terminal 432) as a negative electrode for outputting a direct current is connected to the second front surface pattern 421*b*.

That is, the first front surface pattern 421*a* corresponds to an inlet portion of a loop between P and N formed in the front surface pattern 421, and the second front surface pattern 421*b* corresponds to an outlet portion of the loop between P and N.

The external output conductor 44 for outputting an alternating current converted by the power semiconductor element 422 to a load such as a motor (not illustrated) provided outside the power conversion device 100 is connected to the third front surface pattern 421*c*.

The power semiconductor element 422 is a circuit element that converts power by a switching operation of turning on and off a voltage or a current.

The power semiconductor element 422 is, for example, a switching element such as an IGBT or a MOSFET.

In the present embodiment, as an example, six power semiconductor elements 422 are connected to the front surface pattern 421 on the circuit board 42.

The six power semiconductor elements 422 in the present embodiment include three first power semiconductor elements 422*a* and three second power semiconductor elements 422*b*.

The first power semiconductor element 422*a* is connected to the first front surface pattern 421*a*.

The second power semiconductor element 422*b* is connected to the third front surface pattern 421*c*.

When the power semiconductor element 422 is the IGBT, the power semiconductor element 422 includes an input surface on which an input terminal corresponding to a collector is formed, an output surface on which an output terminal corresponding to an emitter is formed, and a gate corresponding to a control signal input terminal for controlling switching of the power semiconductor element 422.

The input surface of the power semiconductor element 422 is electrically connected to the front surface pattern 421 with a bonding material or the like (not illustrated) therebetween.

For example, one end of a bonding wire (not illustrated) as a conducting wire is electrically connected to the output surface of the power semiconductor element 422.

The input surface of the first power semiconductor element 422*a* is connected to the first front surface pattern 421*a*.

The other end of the bonding wire connected to the output surface of the first power semiconductor element 422*a* is connected to the third front surface pattern 421*c*.

The input surface of the second power semiconductor element 422*b* is connected to the third front surface pattern 421*c*.

The other end of the bonding wire connected to the output surface of the second power semiconductor element 422*b* is connected to the second front surface pattern 421*b*.

DC power is input to the input terminal of the first power semiconductor element 422*a* through the first front surface pattern 421*a*, and the input DC power is converted into AC power by the first power semiconductor element 422*a*.

The converted AC power is output from an output terminal (not illustrated) in the first power semiconductor element 422*a* to the third front surface pattern 421*c* through a bonding wire.

AC power is input to the input terminal of the second power semiconductor element 422*b* through the third front surface pattern 421*c*, and the input AC power is converted into DC power by the second power semiconductor element 422*b*.

The converted DC power is output from an output terminal (not illustrated) in the second power semiconductor element 422*b* to the second front surface pattern 421*b* through a bonding wire.

A control signal generated by a control unit (not illustrated) provided outside the circuit board 42 is input to the power semiconductor element 422.

The power semiconductor element 422 performs switching in accordance with the control signal.

When the power semiconductor element 422 is the MOSFET, the power semiconductor element 422 includes an input surface corresponding to a drain, an output surface corresponding to a source, and a gate corresponding to a control signal input terminal.

For example, solder, a sintered material (powder of a metal or the like), or the like can be adopted as the above-described bonding material used for bonding the base plate 41 and the back surface pattern formed on the second surface 420*b* of the insulating plate 420 to each other, bonding the power semiconductor element 422 and the front surface pattern 421 to each other, and bonding the back surface 41*b* of the base plate 41 and the cooling device 6 to each other.

The main terminal portion 43 is an electric conductor (busbar) that exchanges DC power between the capacitor 3 and the circuit board 42.

The main terminal portion 43 is made of a metal such as copper.

The main terminal portion 43 includes the P-type terminal 431 as the positive electrode and the N-type terminal 432 as the negative electrode.

The P-type terminal 431 and the N-type terminal 432 are arranged side by side with a gap therebetween.

In other words, the N-type terminal 432 is arranged side by side with the P-type terminal 431 with a gap therebetween.

The P-type terminal 431 and the N-type terminal 432 have the same size and shape.

The term "same" in the present embodiment refers to a substantially same state, and a slight manufacturing error and a design tolerance are allowed.

The P-type terminal 431 includes one end portion 431*b* connected to the first front surface pattern 421*a*, and the other end portion 431*a* which extends integrally with the one end portion 431*b* from the one end portion 431*b* and into which a direct current from the positive electrode of the capacitor 3 flows.

The other end portion 431*a* of the P-type terminal 431 has a flat plate shape.

The N-type terminal 432 includes one end portion 432*b* connected to the second front surface pattern 421*b* and the other end portion 432*a* extending integrally with the one end portion 432*b* from the one end portion 432*b* and allowing a direct current to flow out toward the negative electrode of the capacitor 3.

The other end portion 432*a* of the N-type terminal 432 has a flat plate shape.

The external output conductor 44 is an electrical conductor (busbar) for outputting the AC power converted by the power semiconductor element 422 to the outside of the power conversion device 100.

The external output conductor 44 is made of a metal including copper or the like.

One end of the external output conductor 44 is connected to the third front surface pattern 421*c* on the circuit board 42.

As illustrated in FIG. 1, the other end of the external output conductor 44 extends outward beyond the output-side side surface 1*b* of the casing 1.

A wiring (not illustrated) for current output connected to a load such as a motor is connected to the other end of the external output conductor 44, for example.

As indicated by a two-dot chain line in FIG. 2, the reinforcing portion 45 is a member that is fixed to the main surface 41*a* of the base plate 41 and mechanically reinforces the main terminal portion 43 and the external output conductor 44.

The reinforcing portion 45 is made of a synthetic resin material or the like.

The reinforcing portion 45 covers the main terminal portion 43 and the external output conductor 44 from the outside and surrounds the circuit board 42 from the outside.

The reinforcing portion 45 forms a case surrounding the circuit board 42 from the periphery in a direction along the main surface 41*a* of the base plate 41.

Therefore, the reinforcing portion 45 defines a space in which the circuit board 42 is accommodated together with the base plate 41.

The reinforcing portion 45 is fixed to the first surface 420*a* of the base plate 41 with an adhesive or the like therebetween.

For example, an insulating material such as polyphenylene sulfide (PPS) can be adopted as the synthetic resin material for the reinforcing portion 45 in the present embodiment.

An insulating material other than PPS may be used for the reinforcing portion 45.

Hereinafter, in the present embodiment, the space defined by the reinforcing portion 45 and the base plate 41 is referred to as a potting space P.

A liquid potting material (not illustrated) is poured (potting) into the potting space P from the outside, and the front surface pattern 421 on the circuit board 42 and the power semiconductor element 422 each exposed to the potting space P are sealed.

The potting material poured into the potting space P is cured over a predetermined time, and electrically insulates the front surface pattern 421 on the circuit board 42 and the power semiconductor element 422 from a space outside the power module 40.

As the potting material in the present embodiment, for example, silicone gel, an epoxy resin, or the like is adopted.

A synthetic resin other than the silicone gel and the epoxy resin may be used as the potting material.

Cooling Device

As illustrated in FIG. 1, the cooling device 6 is a device that mainly cools the power module 40 of the power conversion unit 4.

The cooling device 6 is provided so as to be stacked on the casing 1, and is fixed to and integrated with the casing 1.

A liquid refrigerant such as water is introduced into the cooling device 6 from the outside.

The liquid refrigerant exchanges heat with the power module 40 and is heated, thereby cooling the power module 40.

Hereinafter, the configuration of the connection conductor 5 that relays DC power between the capacitor 3 and the power module 40 will be described with reference to FIGS. 2 and 3.

Connection Conductor

The connection conductor 5 is an electrical conductor (busbar) made of a metal including copper or the like.

In the present embodiment, three connection conductors 5 are arranged at intervals so as to correspond to the power modules 40. respectively.

Each connection conductor 5 includes a positive electrode-side busbar 51 and a negative electrode-side busbar 52.

The positive electrode-side busbar 51 is a current path that connects the positive electrode of the capacitor 3 and the power module 40.

The negative electrode-side busbar 52 is a current path that connects the negative electrode of the capacitor 3 and the power module 40.

The positive electrode-side busbar 51 and the negative electrode-side busbar 52 are arranged side by side at an interval.

One end of each of the positive electrode-side busbar 51 and the negative electrode-side busbar 52 is connected to the capacitor 3.

A detailed illustration of connection states between the positive electrode-side busbar 51 and the capacitor 3 and between the negative electrode-side busbar 52 and the capacitor 3 are omitted.

The other end of the positive electrode-side busbar 51 is connected to the P-type terminal 431 in the power module 40.

The other end of the negative electrode-side busbar 52 is connected to the N-type terminal 432 of the power module 40.

The positive electrode-side busbar 51 and the negative electrode-side busbar 52 have the same size and shape.

The positive electrode-side busbar 51 and the negative electrode-side busbar 52 in the present embodiment are symmetrically arranged side by side to form a pair.

Hereinafter, an interval generated between the positive electrode-side busbar 51 and the negative electrode-side busbar 52 by being arranged side by side is referred to as a "gap G".

In other words, the negative electrode-side busbar 52 is arranged side by side with the positive electrode-side busbar 51 with the gap G therebetween.

The gap G in the present embodiment has the same dimension as a gap G formed between the P-type terminal 431 and the N-type terminal 432.

An insulation distance (a spatial distance and a creepage distance) is secured in the gap G so that a current flowing through the positive electrode-side busbar 51 does not flow to the negative electrode-side busbar 52 or a current flowing through the negative electrode-side busbar 52 does not flow to the positive electrode-side busbar 51.

The insulation distance in the present embodiment is desirably, for example, 1 mm or more and 10 mm or less.

Figure 3:
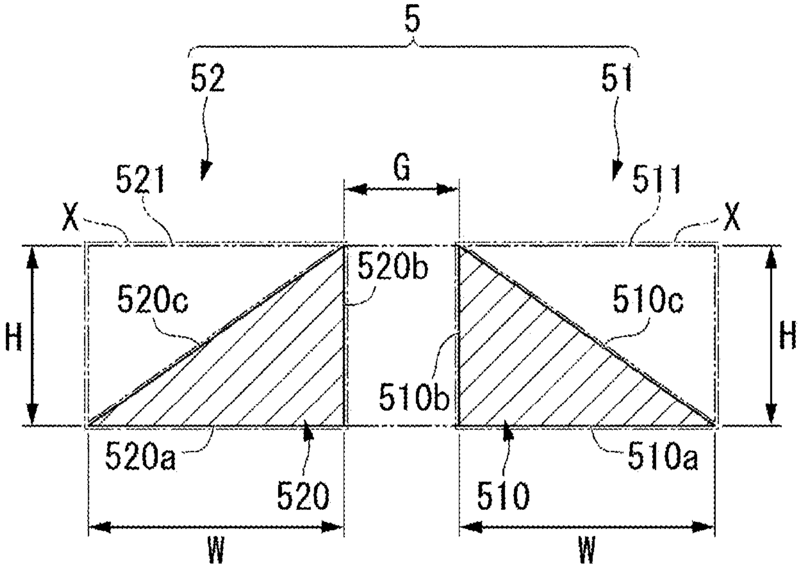
FIG. 3 is a cross-sectional view taken along line III-III illustrated in FIG. 2.

As illustrated in FIG. 3, the positive electrode-side busbar 51 includes a first main body portion 510 and a first cutout portion 511.

The first main body portion 510 in the present embodiment has a columnar shape extending in one direction between the capacitor 3 and the power module 40.

The first main body portion 510 includes a first bottom surface 510*a* abutting on the P-type terminal 431 and a first opposing surface 510*b* rising from the first bottom surface 510*a*.

In the present embodiment, the first bottom surface 510*a* and the first opposing surface 510*b* are perpendicular to each other.

The term "perpendicular" in the present embodiment refers to a substantially perpendicular state, and a slight manufacturing error and a design tolerance are allowed.

The first bottom surface 510*a* is integrally connected to the P-type terminal 431 by, for example, welding.

The first cutout portion 511 is disposed in the first main body portion 510 on a side opposite to the first bottom surface 510*a* and the first opposing surface 510*b*.

Here, the first cutout portion 511 is disposed so as to cut out, in a triangular prism shape in the direction in which the base material X extends, one corner disposed on a side opposite to the first bottom surface 510*a* forming a bottom surface of a base material X and the first opposing surface 510*b* forming a side surface of the base material X among four corners of the base material X forming a quadrangular prism shape forming the first main body portion 510.

A first inclined surface 510*c* that connects an end edge of the first bottom surface 510*a* and an end edge of the first opposing surface 510*b* to each other is formed in the first main body portion 510 by the first cutout portion 511.

Therefore, in the present embodiment, the first main body portion 510 is formed in a triangular prism shape having a right-angled triangular cross section by the first bottom surface 510*a*, the first opposing surface 510*b*, and the first inclined surface 510*c* included in the first main body portion 510.

The "cross section" in the present embodiment means a plane obtained by cutting the first main body portion 510 along a plane orthogonal to the direction in which the first main body portion 510 extends.

The negative electrode-side busbar 52 includes a second main body portion 520 and a second cutout portion 521.

The second main body portion 520 in the present embodiment has a columnar shape extending in the same direction as the direction in which the first main body portion 510 extends between the capacitor 3 and the power module 40.

The second main body portion 520 includes a second bottom surface 520*a* abutting on the N-type terminal 432 and a second opposing surface 520*b* rising from the second bottom surface 520*a*.

In the present embodiment, the second bottom surface 520*a* and the first opposing surface 510*b* are perpendicular to each other.

The second bottom surface 520*a* is integrally connected to the P-type terminal 431 by, for example, welding.

The second opposing surface 520*b* is disposed in parallel to and opposed to the first opposing surface 510*b* with the gap G therebetween.

The second cutout portion 521 is disposed in the second main body portion 520 on a side opposite to the second bottom surface 520*a* and the second opposing surface 520*b*.

Here, the second cutout portion 521 is disposed so as to cut out, in a triangular prism shape in the direction in which the base material X extends, one corner disposed on a side opposite to the second bottom surface 520*a* forming a bottom surface of a base material X and the second opposing surface 520*b* forming a side surface of the base material X among four corners of the base material X forming a quadrangular prism shape forming the second main body portion 520.

A second inclined surface 520*c* that connects an end edge of the second bottom surface 520*a* and an end edge of the second opposing surface 520*b* to each other is formed in the second main body portion 520 by the second cutout portion 521.

Therefore, in the present embodiment, the second main body portion 520 is formed in a triangular prism shape having a right-angled triangular cross section by the second bottom surface 520*a*, the second opposing surface 520*b*, and the second inclined surface 520*c* included in the second main body portion 520.

Here, a dimension of the first opposing surface 510*b* and the second opposing surface 520*b* in the direction perpendicular to the first bottom surface 510*a* and the second bottom surface 520*a*, respectively, is H, a dimension of the first bottom surface 510*a* and the second bottom surface 520*a* in the direction in which the first opposing surface 510*b* and the second opposing surface 520*b* are opposed is W, and the following expression (i) is established.

$$0.2 \leq H/W \leq 1 \quad \text{(i)}$$

Actions and Effects

A current input from the capacitor 3 to the front surface pattern 421 through the positive electrode-side busbar 51 and the P-type terminal 431 each as the positive electrode is converted by the power semiconductor element 422 and then used for rotation of a motor or the like (load) provided outside the power conversion device 100 through the external output conductor 44.

The current used for the rotation of the motor or the like flows into the front surface pattern 421 again through the external output conductor 44, is converted by the power semiconductor element 422, and then returns to the capacitor 3 through the N-type terminal 432 and the negative electrode-side busbar 52 each as the negative electrode.

At this time, the positive electrode-side busbar 51 and the negative electrode-side busbar 52 are arranged side by side with the gap G therebetween, and a flow direction of the current flowing through the positive electrode-side busbar 51 and a flow direction of the current flowing through the negative electrode-side busbar 52 are opposite to each other.

This causes a magnetic flux generated in the positive electrode-side busbar 51 and a magnetic flux generated in the negative electrode-side busbar 52 to be canceled each other.

Since the magnitude of the current flowing in the front surface pattern 421 is rapidly changed by the switching of the power semiconductor element 422 on the circuit board 42, densities of the magnetic fluxes generated in the positive electrode-side busbar 51 and the negative electrode-side busbar 52 are rapidly changed according to the change.

At this time, in the positive electrode-side busbar 51 and the negative electrode-side busbar 52, counter electromotive forces (eddy currents) that generate magnetic fluxes that cancel changes in the densities of the magnetic fluxes are also generated.

The above-described configuration can secure larger areas of the first opposing surface 510*b* of the first main body portion 510 and the second opposing surface 520*b* of the second main body portion 520 by the first cutout portion 511 disposed in the first main body portion 510 and the second cutout portion 521 disposed in the second main body portion 520 as compared with, for example, a connection conductor 5 having a flat plate shape (quadrangular prism).

That is, opposing areas of the first main body portion 510 and the second main body portion 520 can be increased.

This can increase amounts of magnetic fluxes that cancel each other between the positive electrode-side busbar 51 and the negative electrode-side busbar 52.

It is possible to secure large areas of the first opposing surface 510*b* of the first main body portion 510 and the second opposing surface 520*b* of the second main body portion 520 without changing cross-sectional areas and weights of the first main body portion 510 and the second main body portion 520.

Thus parasitic inductance generated in the connection conductor 5 can be reduced while suppressing an increase in size and weight of the connection conductor 5.

Other Embodiments

Although the embodiments of the present disclosure have been described above in detail with reference to the drawings, specific configurations are not limited to the configurations of the embodiments, and additions, omissions, substitutions, and other modifications of the configurations can be made without departing from the gist of the present disclosure.

In the above embodiment, the configuration of the first main body portion 510 and the second main body portion 520 formed in the triangular prism shape having the right-angled triangular cross section has been described. However, a configuration is not limited to this configuration.

Hereinafter, shapes that the first main body portion 510 and the second main body portion 520 can have will be described in a plurality of modifications (modifications 1 to 3).

In the configuration described below, the above equation (i) is satisfied.

Modification 1

Figure 4:
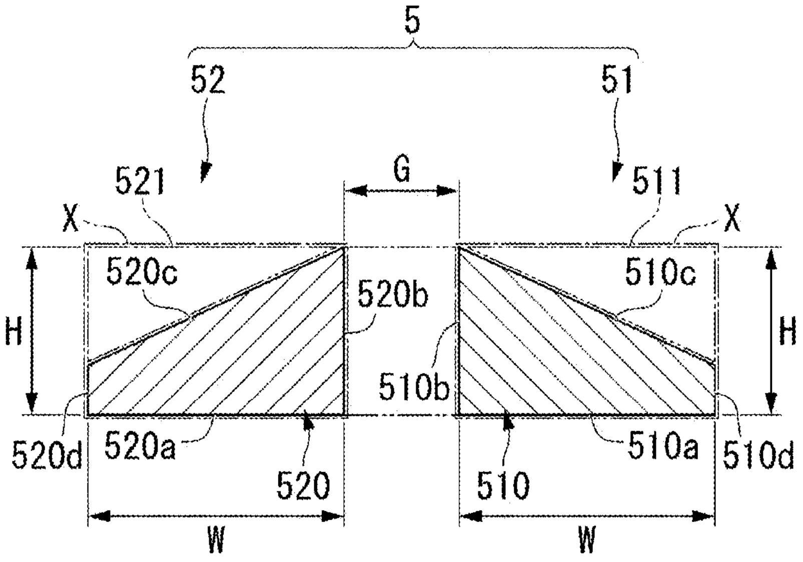
FIG. 4 is a cross-sectional view of a connection conductor according to another embodiment of the present disclosure, corresponding to the portion illustrated in FIG. 3.

The positive electrode-side busbar 51 and the negative electrode-side busbar 52 may have configurations as illustrated in FIG. 4, for example.

In this case, the positive electrode-side busbar 51 includes the first main body portion 510 and the first cutout portion 511.

The first main body portion 510 includes the first bottom surface 510*a* abutting on the P-type terminal 431, the first opposing surface 510*b* rising from the first bottom surface 510*a*, and a first side surface 510*d* rising from the first bottom surface 510*a* and opposing a side opposite to the first opposing surface 510*b* in a state of being parallel to the first opposing surface 510*b*.

The first cutout portion 511 is disposed in the first main body portion 510 on a side opposite to the first bottom surface 510*a* and the first opposing surface 510*b*.

The first cutout portion 511 is disposed so as to cut out, in a triangular prism shape in the direction in which the base material X extends, one corner disposed on a side opposite to the first bottom surface 510*a* forming a bottom surface of a base material X and the first opposing surface 510*b* forming a side surface of the base material X among four corners of the base material X forming a quadrangular prism shape forming the first main body portion 510.

A first inclined surface 510*c* that connects an end edge of the first opposing surface 510*b* and an end edge of the first side surface 510*d* to each other is formed in the first main body portion 510 by the first cutout portion 511.

Therefore, the first main body portion 510 in this configuration is formed in a quadrangular prism shape having a trapezoidal cross section by the first bottom surface 510*a*, the first opposing surface 510*b*, the first side surface 510*d*, and the first inclined surface 510*c* included in the first main body portion 510.

Therefore, when viewing the cross section of the first main body portion 510, the first side surface 510*d* corresponds to an upper base of the trapezoidal shape, and the first opposing surface 510*b* corresponds to a lower base of the trapezoidal shape.

The negative electrode-side busbar 52 includes a second main body portion 520 and a second cutout portion 521.

The second main body portion 520 includes the second bottom surface 520*a* abutting on the N-type terminal 432, the second opposing surface 520*b* rising from the second bottom surface 520*a*, and a second side surface 520*d* rising from the second bottom surface 520*a* and opposing a side opposite to the second opposing surface 520*b* in a state of being parallel to the second opposing surface 520*b*.

The second opposing surface 520*b* is disposed in parallel to and opposed to the first opposing surface 510*b* with the gap G therebetween.

The second cutout portion 521 is disposed in the second main body portion 520 on a side opposite to the second bottom surface 520*a* and the second opposing surface 520*b*.

The second cutout portion 521 is disposed so as to cut out, in a triangular prism shape in the direction in which the base material X extends, one corner disposed on a side opposite to the second bottom surface 520*a* forming a bottom surface of a base material X and the second opposing surface 520*b* forming a side surface of the base material X among four corners of the base material X forming a quadrangular prism shape forming the second main body portion 520.

A second inclined surface 520*c* that connects an end edge of the second opposing surface 520*b* and an end edge of the second side surface 520*d* to each other is formed in the second main body portion 520 by the second cutout portion 521.

Therefore, the second main body portion 520 in this configuration is formed in a quadrangular prism shape having a trapezoidal cross section by the second bottom surface 520*a*, the second opposing surface 520*b*, the second side surface 520*d*, and the second inclined surface 520*c* included in the second main body portion 520.

Therefore, when viewing the cross section of the second main body portion 520, the second side surface 520*d* corresponds to an upper base of the trapezoidal shape, and the second opposing surface 520*b* corresponds to a lower base of the trapezoidal shape.

Modification 2

Figure 5:
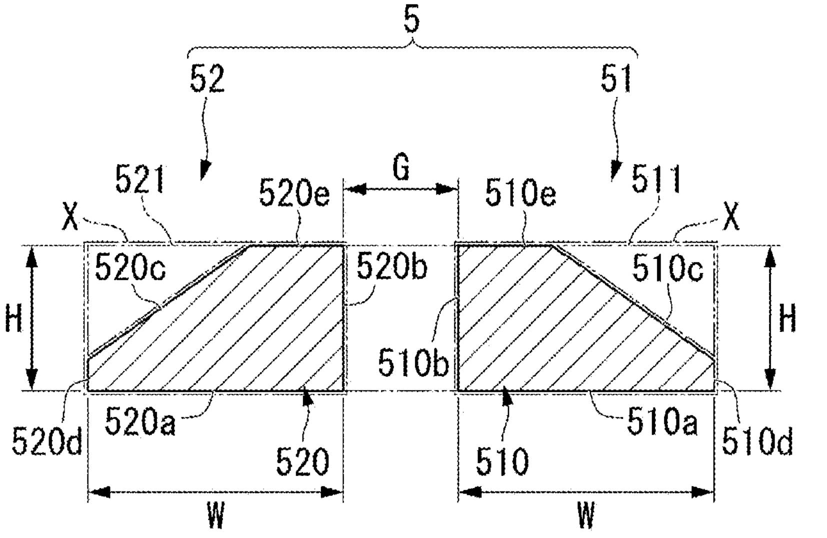
FIG. 5 is a cross-sectional view of a connection conductor according to another embodiment of the present disclosure, corresponding to the portion illustrated in FIG. 3.

The positive electrode-side busbar 51 and the negative electrode-side busbar 52 may have configurations as illustrated in FIG. 5, for example.

In this case, the positive electrode-side busbar 51 includes the first main body portion 510 and the first cutout portion 511.

The first main body portion 510 includes the first bottom surface 510*a* abutting on the P-type terminal 431, the first opposing surface 510*b* rising from the first bottom surface 510*a*, the first side surface 510*d* rising from the first bottom surface 510*a* and opposing a side opposite to the first opposing surface 510*b* in a state of being parallel to the first opposing surface 510*b*, and a first upper surface 510*e* that is connected to the first opposing surface 510*b* and faces a side opposite to the first bottom surface 510*a* in a state of being parallel to the first bottom surface 510*a*.

The first cutout portion 511 is disposed in the first main body portion 510 on a side opposite to the first bottom surface 510*a* and the first opposing surface 510*b*.

The first cutout portion 511 is disposed so as to cut out, in a triangular prism shape in the direction in which the base material X extends, one corner disposed on a side opposite to the first bottom surface 510*a* forming a bottom surface of a base material X and the first opposing surface 510*b* forming a side surface of the base material X among four corners of the base material X forming a quadrangular prism shape forming the first main body portion 510.

A first inclined surface 510*c* that connects an end edge of the first upper surface 510*e* and an end edge of the first side surface 510*d* to each other is formed in the first main body portion 510 by the first cutout portion 511.

Therefore, the first main body portion 510 in this configuration is formed in a pentagonal prism shape having a pentagonal cross section by the first bottom surface 510*a*, the first opposing surface 510*b*, the first side surface 510*d*, the upper surface 510*e*, and the first inclined surface 510*c* included in the first main body portion 510.

The negative electrode-side busbar 52 includes a second main body portion 520 and a second cutout portion 521.

The second main body portion 520 includes the second bottom surface 520*a* abutting on the N-type terminal 432, the second opposing surface 520*b* rising from the second bottom surface 520*a*, the second side surface 520*d* rising from the second bottom surface 520*a* and opposing a side opposite to the second opposing surface 520*b* in a state of being parallel to the second opposing surface 520*b*, and a second upper surface 520*e* that is connected to the second opposing surface 520*b* and faces a side opposite to the second bottom surface 520*a* in a state of being parallel to the second bottom surface 520*a*.

The second opposing surface 520*b* is disposed in parallel to and opposed to the first opposing surface 510*b* with the gap G therebetween.

The second cutout portion 521 is disposed in the second main body portion 520 on a side opposite to the second bottom surface 520*a* and the second opposing surface 520*b*.

The second cutout portion 521 is disposed so as to cut out, in a triangular prism shape in the direction in which the base material X extends, one corner disposed on a side opposite to the second bottom surface 520*a* forming a bottom surface of a base material X and the second opposing surface 520*b* forming a side surface of the base material X among four corners of the base material X forming a quadrangular prism shape forming the second main body portion 520.

A second inclined surface 520*c* that connects an end edge of the second upper surface 520*e* and an end edge of the second side surface 520*d* to each other is formed in the second main body portion 520 by the second cutout portion 521.

Therefore, the second main body portion 520 in this configuration is formed in a pentagonal prism shape having a pentagonal cross section by the second bottom surface 520*a*, the second opposing surface 520*b*, the second side surface 520*d*, the second upper surface 520*e*, and the second inclined surface 520*c* included in the second main body portion 520.

Modification 3

Figure 6:
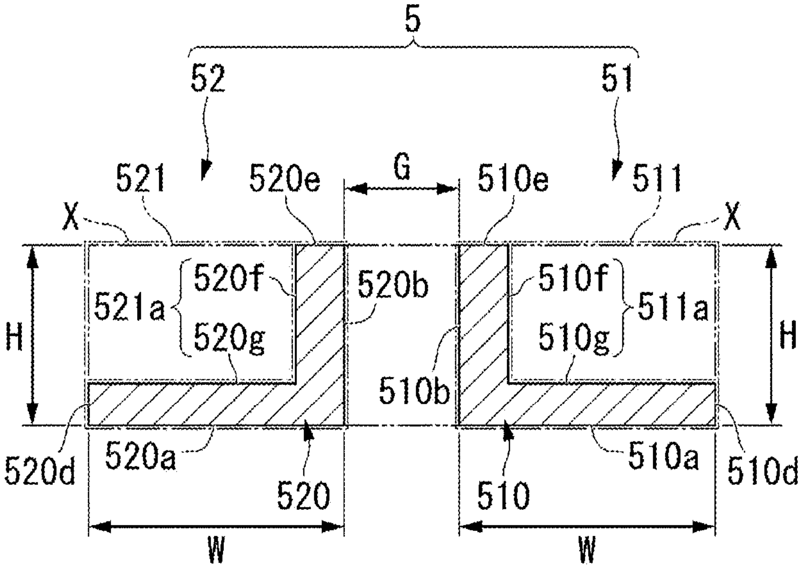
FIG. 6 is a cross-sectional view of a connection conductor according to another embodiment of the present disclosure, corresponding to the portion illustrated in FIG. 3.

The positive electrode-side busbar 51 and the negative electrode-side busbar 52 may have configurations as illustrated in FIG. 6, for example.

In this case, the positive electrode-side busbar 51 includes the first main body portion 510 and the first cutout portion 511.

The first main body portion 510 includes the first bottom surface 510*a* abutting on the P-type terminal 431, the first opposing surface 510*b* rising from the first bottom surface 510*a*, the first side surface 510*d* rising from the first bottom surface 510*a* and opposing a side opposite to the first opposing surface 510*b* in a state of being parallel to the first opposing surface 510*b*, and the first upper surface 510*e* that is connected to the first opposing surface 510*b* and faces a side opposite to the first bottom surface 510*a* in a state of being parallel to the first bottom surface 510*a*.

The first cutout portion 511 is disposed in the first main body portion 510 on a side opposite to the first bottom surface 510*a* and the first opposing surface 510*b*.

The first cutout portion 511 is disposed so as to cut out, in a quadrangular prism shape in the direction in which the base material X extends, one corner disposed on a side opposite to the first bottom surface 510*a* forming a bottom surface of a base material X and the first opposing surface 510*b* forming a side surface of the base material X among four corners of the base material X forming a quadrangular prism shape forming the first main body portion 510.

A first cut surface 511*a* that connects an end edge of the first upper surface 510*e* and an end edge of the first side surface 510*d* to each other is formed in the first main body portion 510 by the first cutout portion 511.

The first cut surface 511*a* includes a first opposite surface 510*f* that is connected to the first upper surface 510*e* and faces a side opposite to the first opposing surface 510*b* in a state of being parallel to the first opposing surface 510*b*, and a first front surface 510*g* that connects the first opposite surface 510*f* and the first side surface 510*d* to each other and faces a side opposite to the first bottom surface 510*a* in a state of being parallel to the first bottom surface 510*a*.

Therefore, the first main body portion 510 in this configuration is formed in a hexagonal columnar shape having an L-shaped cross section by the first bottom surface 510*a*, the first opposing surface 510*b*, the first side surface 510*d*, and the first cut surface 511*a* included in the first main body portion 510.

The negative electrode-side busbar 52 includes a second main body portion 520 and a second cutout portion 521.

The second main body portion 520 includes the second bottom surface 520*a* abutting on the N-type terminal 432, the second opposing surface 520*b* rising from the second bottom surface 520*a*, the second side surface 520*d* rising from the second bottom surface 520*a* and opposing a side opposite to the second opposing surface 520*b* in a state of being parallel to the second opposing surface 520*b*, and a second upper surface 520*e* that is connected to the second opposing surface 520*b* and faces a side opposite to the second bottom surface 520*a* in a state of being parallel to the second bottom surface 520*a*.

The second opposing surface 520*b* is disposed in parallel to and opposed to the first opposing surface 510*b* with the gap G there between.

The second cutout portion 521 is disposed in the second main body portion 520 on a side opposite to the second bottom surface 520*a* and the second opposing surface 520*b*.

The second cutout portion 521 is disposed so as to cut out, in a quadrangular prism shape in the direction in which the base material X extends, one corner disposed on a side opposite to the second bottom surface 520*a* forming a bottom surface of a base material X and the second opposing surface 520*b* forming a side surface of the base material X among four corners of the base material X forming a quadrangular prism shape forming the second main body portion 520.

A second cut surface 521*a* that connects an end edge of the second upper surface 520*e* and an end edge of the second side surface 520*d* to each other is formed in the second main body portion 520 by the second cutout portion 521.

The second cut surface 521*a* includes a second opposite surface 520*f* that is connected to the second upper surface 520*e* and faces a side opposite to the second opposing surface 520*b* in a state of being parallel to the second opposing surface 520*b*, and a second front surface 520*g* that connects the second opposite surface 520*f* and the second side surface 520*d* to each other and faces a side opposite to the second bottom surface 520*a* in a state of being parallel to the second bottom surface 520*a*.

Therefore, the second main body portion 520 in this configuration is formed in a hexagonal columnar shape having an L-shaped cross section by the second bottom surface 520*a*, the second opposing surface 520*b*, the second side surface 520*d*, and the second cut surface 521*a* included in the second main body portion 520.

A plurality of examples of the shapes that the first main body portion 510 and the second main body portion 520 can have been described above.

Instead of the configuration of the connection conductor 5 described above, as illustrated in FIG. 7, the connection conductor 5 may include a plurality of the pairs of the positive electrode-side busbar 51 and the negative electrode-side busbar 52.

In the present configuration, five pairs of the positive electrode-side busbar 51 and the negative electrode-side busbar 52 are exemplified.

Figure 8:
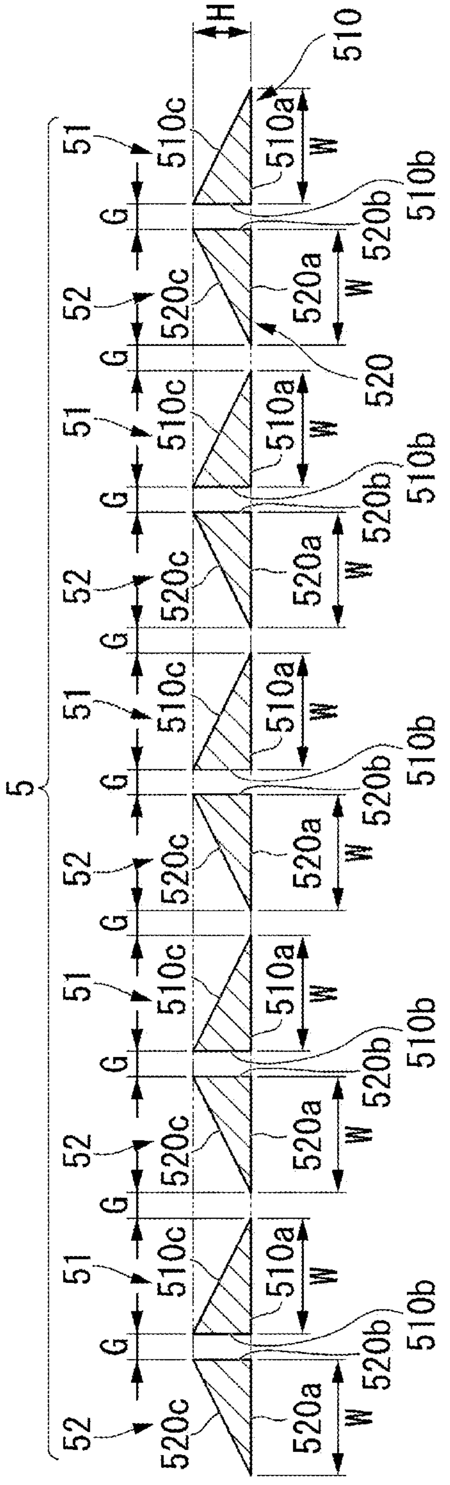
FIG. 8 is a cross-sectional view taken along line VIII-VIII illustrated in FIG. 7.

At this time, as illustrated in FIG. 8, the plurality of pairs of the positive electrode-side busbar 51 and the negative electrode-side busbar 52 are arranged side by side at equal intervals in the direction in which the first opposing surface 510*b* and the second opposing surface 520*b* are opposed to each other.

The pair of the positive electrode-side busbar 51 and the negative electrode-side busbar 52 are arranged side by side with a gap G therebetween, and the insulation distance is secured between the pair of the positive electrode-side busbar 51 and the negative electrode-side busbar 52.

Figure 7:
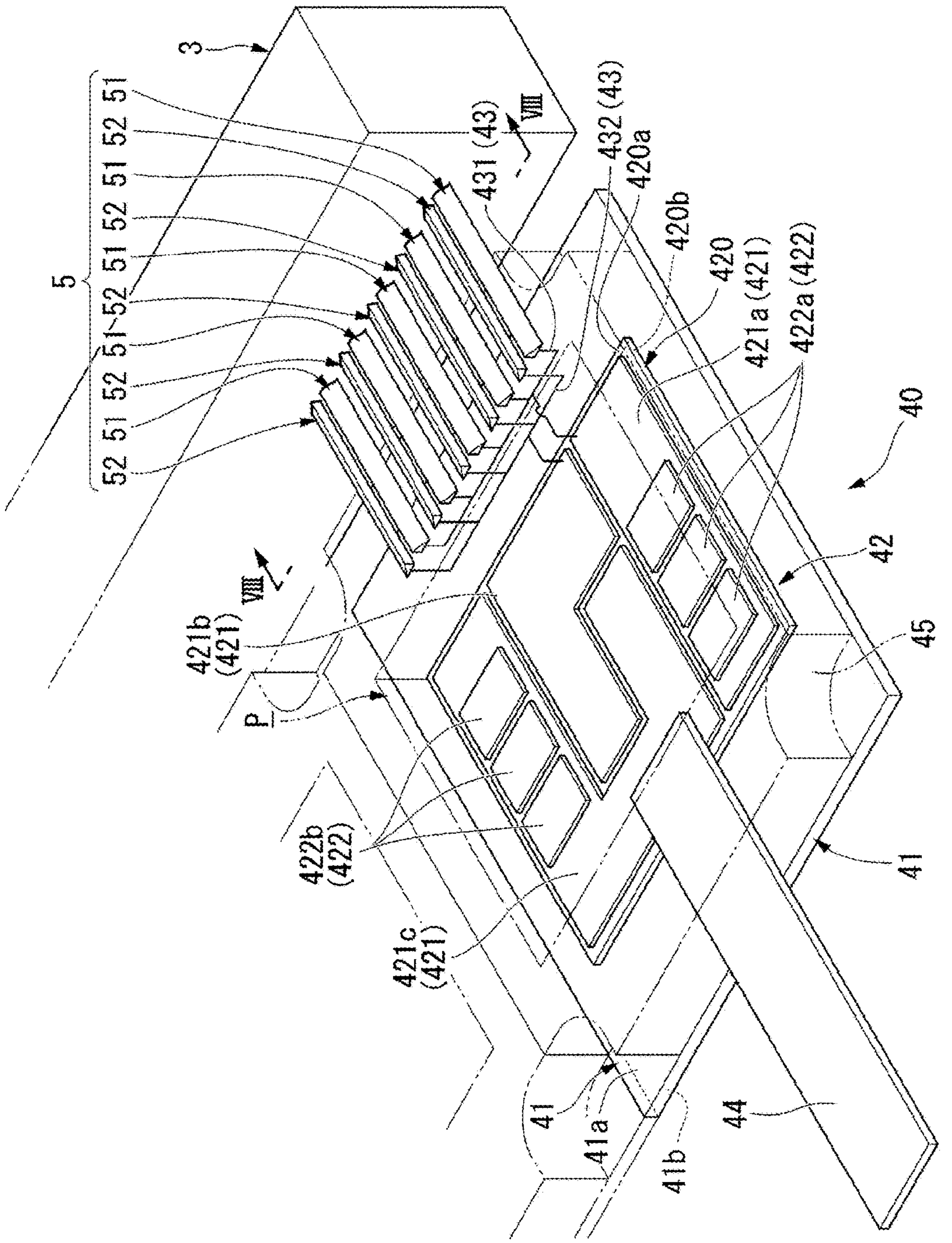
FIG. 7 is an enlarged perspective view illustrating a main part of the power conversion device according to another embodiment of the present disclosure.

Although detailed illustration is omitted, as illustrated in FIG. 7, each positive electrode-side busbar 51 is connected to the first front surface pattern 421*a* through the P-type terminal 431 (indicated by a solid line), and each negative electrode-side busbar 52 is connected to the second front surface pattern 421*b* through the N-type terminal 432 (indicated by a solid line).

According to the above configuration, the connection conductor 5 is constituted by the plurality of pairs of the positive electrode-side busbar 51 and the negative electrode-side busbar 52.

Accordingly, as compared with a case where the connection conductor 5 is a pair of the positive electrode-side busbar 51 and the negative electrode-side busbar 52, the current path is divided into a plurality of paths, and the total opposing areas of the first opposing surface 510*b* and the second opposing surface 520*b* in the positive electrode-side busbar 51 and the negative electrode-side busbar 52 can be increased.

Thus, the parasitic inductance generated in the connection conductor 5 can be further reduced.

FIGS. 7 and 8 illustrate a case where the first main body portion 510 of the positive electrode-side busbar 51 and the second main body portion 520 of the negative electrode-side busbar 52 each have the triangular prism shape, but a configuration is not limited to this configuration.

That is, the positive electrode-side busbar 51 and the negative electrode-side busbar 52 may have the configurations described in modifications 1 to 3.

In the above embodiment, the first bottom surface 510*a* of the first main body portion 510 is integrally connected to the P-type terminal 431 and the second bottom surface 520*a* of the second main body portion 520 is connected to the N-type terminal 432 by welding. However, a configuration is not limited to this configuration.

The first main body portion 510 and the P-type terminal 431, and the second main body portion 520 and the N-type terminal 432 may be connected to each other by a fastening member or the like including a bolt and a nut.

The first cutout portion 511 may be disposed in a portion of the first main body portion 510.

The second cutout 521 may also be disposed in a portion of the second main body portion 520.

The configurations of the first main body portion 510 and the second main body portion 520 are not limited to the above, and for example, in the first main body portion 510 and the second main body portion 520, only a portion where the fastening member is disposed and connected to the main terminal portion 43 may be formed in a flat plate shape.

That is, the first cutout portion 511 may be disposed in at least part of the first main body portion 510 on a side opposite to the first bottom surface 510*a* and the first opposing surface 510*b*, and the second cutout portion 521 may be disposed in at least part of the second main body portion 520 on a side opposite to the second bottom surface 520*a* and the second opposing surface 520*b*.

In the embodiment, the configuration in which the first surface 420*a* and the second surface 420*b* of the base plate 41 are respectively parallel to the first surface 420*a* and the second surface 420*b* of the insulating plate 420 in the back-to-back relationship has been described. However, a configuration is not limited to this configuration and may have a slightly inclined configuration.

In the above embodiment, the configuration of the power conversion device 100 in which the power conversion unit 4 is a six-in-one module including three power modules 40 has been described. However, a configuration is not limited thereto.

For example, in the power conversion device 100, the power conversion unit 4 may be a two-in-one module including one power module 40.

In the above embodiment, the inverter has been described as an example of the power conversion device 100. However, the power conversion device 100 is not limited to the inverter.

The power conversion device 100 may be a device that performs power conversion by the power semiconductor element 422, such as a converter or a combination of an inverter and a converter.

When the power conversion device 100 is the converter, an AC voltage may be input from an external input power supply (not illustrated) to the external output conductor 44, the power semiconductor element 422 on the circuit board 42 may convert the AC voltage into a DC voltage, and the DC voltage from the power semiconductor element 422 may be output to the outside of the power conversion device 100 through the main terminal portion 43 and the connection conductor 5.

Notes

The power conversion device described in the embodiment is understood as follows, for example.

(1) A power conversion device 100 according to a first aspect includes a capacitor 3 to which DC power is supplied, a power module 40 configured to convert a DC voltage from the capacitor 3 into an AC voltage and output the AC voltage, and a connection conductor 5 including a positive electrode-side busbar 51 configured to connect the capacitor 3 and a P-type terminal 431 of the power module 40, and a negative electrode-side busbar 52 having a shape identical to a shape of the positive electrode-side busbar 51, symmetrically arranged side by side with the positive electrode-side busbar 51 in pairs with a gap G therebetween, and configured to connect the capacitor 3 and an N-type terminal 432 of the power module 40. The positive electrode-side busbar 51 includes a first main body portion 510 including a first bottom surface 510*a* abutting on the P-type terminal 431 and a first opposing surface 510*b* rising from the first bottom surface 510*a* and a first cutout portion 511 disposed in at least part of the first main body portion 510 on a side opposite to the first bottom surface 510*a* and the first opposing surface 510*b*. The negative electrode-side busbar 52 includes a second main body portion 520 including a second bottom surface 520*a* abutting on the N-type terminal 432 and a second opposing surface 520*b* rising from the second bottom surface 520*a* and disposed in parallel to and opposed to the first opposing surface 510*b* with the gap G therebetween and a second cutout portion 521 disposed in at least part of the second main body portion 520 on a side opposite to the second bottom surface 520*a* and the second opposing surface 520*b*.

This can increase opposing areas of the first main body portion 510 and the second main body portion 520.

That is, it is possible to increase amounts of magnetic fluxes that cancel each other between the positive electrode-side busbar 51 and the negative electrode-side busbar 52.

It is possible to secure large areas of the first opposing surface 510*b* of the first main body portion 510 and the second opposing surface 520*b* of the second main body portion 520 without changing cross-sectional areas and weights of the first main body portion 510 and the second main body portion 520.

(2) The power conversion device 100 according to a second aspect is the power conversion device 100 according to the first aspect, wherein a dimension of the first opposing surface 510*b* in a direction perpendicular to the first bottom surface 510*a* is H, a dimension of the first bottom surface 510*a* in a direction in which the first opposing surface 510*b* and the second opposing surface 520*b* are opposed is W, and $0.2 \leq H/W \leq 1$ may be satisfied. This can achieve the above-described action with more specific setting values.

(3) The power conversion device 100 according to a third aspect is the power conversion device 100 according to the first aspect or the second aspect, in which the connection conductor 5 may include a plurality of pairs of the positive electrode-side busbar 51 and the negative electrode-side busbar 52. The plurality of pairs of the positive electrode-side busbar 51 and the negative electrode-side busbar 52 may be arranged side by side at equal intervals in a direction in which the first opposing surface 510*b* and the second opposing surface 520*b* are opposed to each other.

Accordingly, as compared with a case where the connection conductor 5 is a pair of the positive electrode-side busbar 51 and the negative electrode-side busbar 52, the current path is divided into a plurality of paths, and the total opposing areas of the first opposing surface 510*b* and the second opposing surface 520*b* in the positive electrode-side busbar 51 and the negative electrode-side busbar 52 can be increased.

INDUSTRIAL APPLICABILITY

According to the present disclosure, a power conversion device that can reduce parasitic inductance generated in a connection conductor while suppressing an increase in size and weight of the connection conductor can be provided.

REFERENCE SIGNS LIST

1 Casing
1*a* Input-side side surface
1*b* Output-side side surface
2 External Input Conductor
3 Capacitor
4 Power conversion unit
5. Connection conductor
6 Cooling device
40 Power module
41 Base plate
41*a* Main surface
41*b* Back surface
42 Circuit board
43 Main terminal portion
44 External output conductor
45 Reinforcing portion
51 Positive electrode-side busbar
52 Negative electrode-side busbar
100 Power conversion device
420 Insulating plate
420*a* First surface
420*b* Second surface
421 Front surface pattern
421*a* First front surface pattern
421*b* Second front surface pattern
421*c* Third front surface pattern
422 Power semiconductor element
422*a* First power semiconductor element
422*b* Second power semiconductor element
431 P-type terminal
431*a*, 432*a* Other end portion
431*b*, 432*b* One end portion
432 N-type terminal
510 First main body portion
510*a* First bottom surface
510*b* First opposing surface
510*c* First inclined surface
510*d* First side surface
510*e* First upper surface
510*f* First opposite surface
510g First front surface
511 First cutout portion
511*a* First cut surface

520 Second main body portion
520*a* Second bottom surface
520*b* Second opposing surface
520*c* Second inclined surface
520*d* Second side surface
520*e* Second upper surface
520*f* Second opposite surface
520*d* Second front surface
521 Second cutout portion
521*a* Second cut surface
G Gap
P Potting space
X Base material

The invention claimed is:

1. A power conversion device, comprising:

a capacitor to which DC power is supplied;

a power module configured to convert a DC voltage from the capacitor into an AC voltage and output the AC voltage; and a connection conductor including a positive electrode-side busbar configured to connect the capacitor and a P-type terminal of the power module and a negative electrode-side busbar having a shape identical to a shape of the positive electrode-side busbar, symmetrically arranged side by side with the positive electrode-side busbar in pairs with a gap therebetween, and configured to connect the capacitor and an N-type terminal of the power module, wherein the positive electrode-side busbar includes a first main body portion including a first bottom surface abutting on the P-type terminal and a first opposing surface rising from the first bottom surface and a first cutout portion disposed in at least part of the first main body portion on a side opposite to the first bottom surface and the first opposing surface, and the negative electrode-side busbar includes a second main body portion including a second bottom surface abutting on the N-type terminal and a second opposing surface rising from the second bottom surface and disposed in parallel to and opposed to the first opposing surface with a gap therebetween, a second cutout portion disposed in at least part of the second main body portion on a side opposite to the second bottom surface and the second opposing surface, the connection conductor includes a plurality of pairs of the positive electrode-side busbar and the negative electrode-side busbar, and the plurality of pairs of the positive electrode-side busbar and the negative electrode-side busbar are arranged side by side at equal intervals in a direction in which the first opposing surface and the second opposing surface are opposed to each other.

2. The power conversion device according to claim 1, wherein a dimension of the first opposing surface in a direction perpendicular to the first bottom surface is H, a dimension of the first bottom surface in a direction in which the first opposing surface and the second opposing surface are opposed to each other is W, and $0.2 \leq H/W \leq 1$ is satisfied.

* * * * *